United States Patent [19]

Eul et al.

[11] Patent Number: 5,313,166
[45] Date of Patent: May 17, 1994

[54] METHOD OF CALIBRATING A NETWORK ANALYZER

[75] Inventors: Hermann-Josef Eul, Oberschleissheim; Burkhard Schiek, Bochum, both of Fed. Rep. of Germany

[73] Assignee: Rohde & Schwarz GmbH & Co. KG, Fed. Rep. of Germany

[21] Appl. No.: 774,604

[22] Filed: Oct. 10, 1991

[30] Foreign Application Priority Data

Nov. 11, 1990 [DE] Fed. Rep. of Germany ....... 4038045
Aug. 2, 1991 [DE] Fed. Rep. of Germany ....... 4125624

[51] Int. Cl.$^5$ ............................................ G01R 27/04
[52] U.S. Cl. ................................ 324/601; 364/571.01; 364/571.02
[58] Field of Search ................... 324/601, 637, 638; 364/571.01, 571.08, 571.02

[56] References Cited

U.S. PATENT DOCUMENTS 4,853,613 8/1989 Sequeira ........................... 324/601
4,982,164 1/1991 Schiek ............................... 324/601
5,097,215 3/1992 Eul .................................... 324/601

OTHER PUBLICATIONS

Rytting: "Advances in MW Error Correction Techniques"-HP Symposiums Mar. 82-pp. 21-30.

*Primary Examiner*—Kenneth A. Wieder
*Assistant Examiner*—Jose M. Solis
*Attorney, Agent, or Firm*—Hill, Steadman & Simpson

[57] ABSTRACT

In a method of calibrating a network analyzer, in which calibration measurements are performed in succession in a random sequence on several different calibration standards which are linked to the two test ports, the first calibration standard used is a two-port unit which is linked between the two test ports and of which all complex scattering parameters are known, and the further calibration standards used are three one-port units of random, though different, reflection characteristics which are successively linked to one of the two test ports, or are linked in any desired combination to both test ports.

8 Claims, 1 Drawing Sheet

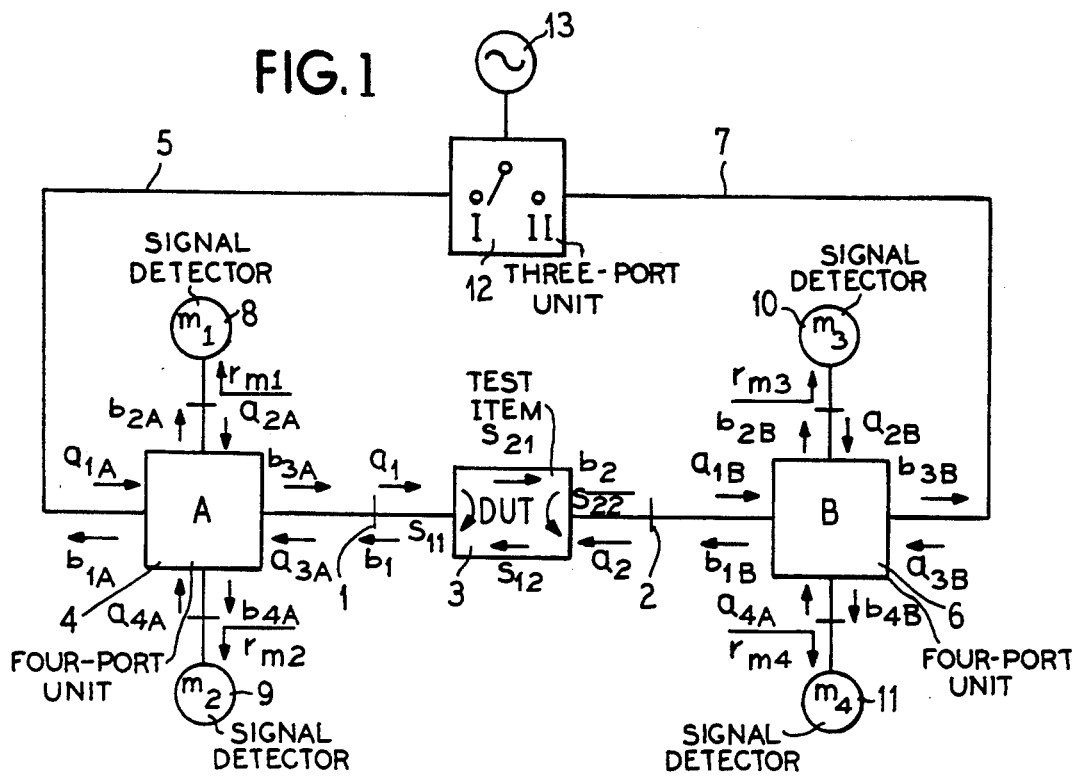
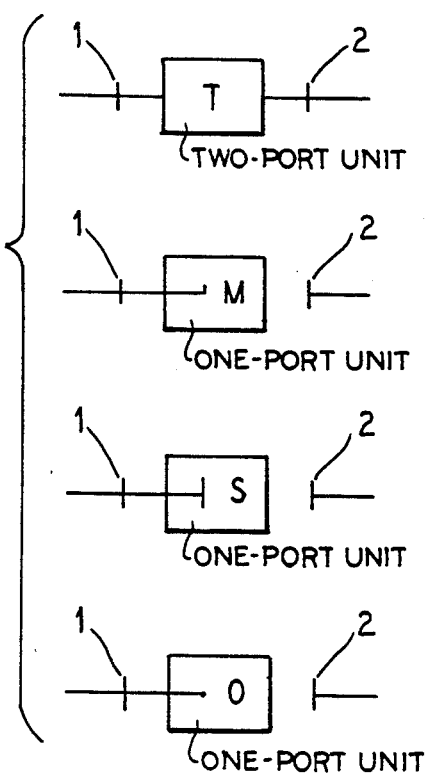

METHOD OF CALIBRATING A NETWORK ANALYZER

BACKGROUND OF THE INVENTION

1. Field of the Invention

The invention is directed to a method for calibrating a network analyzer.

2. Description of the Prior Art

A method of the specified type is known (U.S. Pat. No. 4,982,164). Here, it is preferred to use as the two-port unit a direct connection of the two test ports (Through Testing) where four calibration measurements are performed. Subsequently, at least three further calibration measurements are performed on two further calibration standards; for example a one-port unit R of known reflection (Reflect Testing) is used as the second calibration standard which is successively linked to the two test ports, and preferably a matched load M (Matched Load) is used therefor. A one-port unit of random reflection which is, however, different from the reflection of the second calibration standard, is used as the third calibration standard, for example a short circuit S (Short Circuit) or an open circuit (Open Circuit) that is linked to only one of the two test ports. As compared with the commonly used 12-term calibration method ("Neues von Rohde & Schwarz" 108, winter of 1984/85, pp. 26 and 27) this known calibration method is simpler because, in addition to the calibration two-port unit of which all complex scattering parameters are known (e.g. two-port T), only three further calibration standards are required (e.g. M1, M2, S1); however, this method does not eliminate a drawback of the commonly used 12-term method which resides in that both of the test ports must be accessible for these additional tests on calibration one-port units, because one of the one-ports, for instance the matched load M, must still be linked to the two test ports.

SUMMARY OF THE INVENTION

It is therefore an object of the present invention to provide a calibration method for network analyzers which can be performed more easily and for which even simpler calibration standards are required.

According to a method of the invention for calibrating a network analyzer, calibration measurements are performed successively in any desired order on different calibration standards linked between two test ports. As a first calibration standard, a two-port unit used, all of whose complex scattering parameters are known and which is linked between the two test ports. As further calibration standards, three one-port units are used of arbitrary, though different and known, reflection characteristics which are successively linked to one of the two test ports, or are linked in any desired combination to both test ports.

With the method according to the present invention it is no longer necessary for the additional calibration measurements at both test ports to be performed on one-port units, but it has now been made possible to successively link the three one-port units to only one of the two test ports. This also allows calibration measurements on a network analyzer in which for some reason one of the two test ports is either inaccessible or is accessible only with difficulties. Since it does not matter with the method according to the invention to which of the two test ports the one-port units are linked, it is therefore also possible with this method to calibrate in a simple way network analyzers the two test port terminals of which are differently configured so that for example one test-port is a coaxial-line connector while the other test port is a coaxial-line jack. For the calibration of such a network analyzer the calibration one-port units may have either a coaxial-line connector terminal or a coaxial-line jack terminal; the number and kind of calibration standards to be made available to the user is thereby substantially reduced and simplified. With the method according to the present invention, the calibration constants are not influenced by the properties of the reversing switch which is commonly provided in such network analyzers and by means of which the two test circuits are coupled to the feeding RF generator, so that no extreme demands are made on the properties of said switch with respect to isolation and reproducibility.

BRIEF DESCRIPTION OF THE DRAWINGS

Other objects, features and advantages of the invention, its organization, construction and operation will be best understood from the following detailed description taken in conjunction with the accompanying drawings, in which:

FIG. 1 is a basic circuit diagram of a network analyzer, and

FIG. 2 illustrates the various possibilities for linking the calibration one-port units, which are listed in the table of FIG. 3.

FIG. 3 is a table listing the possibilities of FIG. 2.

DESCRIPTION OF THE PREFERRED EMBODIMENTS

FIG. 1 is the basic circuit diagram of a network analyzer of the type designed, for example, on the principle of a network analyzer ZPV-Z5 of Rohde & Schwarz including four test points and comprising two test ports 1 and 2 between which a test item 3 can be linked. The test port 1 is linked through a four-port unit 4 to a measuring branch 5 while the test port 2 is linked through a four-port unit 6 to a measuring branch 7. The two four-port units 4, 6 may be designed as measuring bridges or directional couplers and are coupled to signal detectors 8, 9 and 10, 11, respectively, by means of which voltage measurements by magnitude and phase can be performed. The two measuring branches 5 and 7 can be alternately coupled through a three-port unit 12 such as a simple reversing switch to an RF generator 13. With a network analyzer of this kind it is possible to measure the complex reflection factors $S_{11}$ and $S_{22}$ and the complex transmission factors $S_{12}$ and $S_{21}$ illustrated in FIG. 1.

In order to determine system errors of such a network analyzer for subsequent consideration in measuring a test item, a calibration method on calibration standards is performed prior to measuring a test item, said calibration standards being linked instead of the test item 3 to the test ports 1 and 2, respectively, as illustrated schematically in FIG. 2. Initially, in a first calibration step a two-port unit T of which all complex scattering parameters are known is linked between the two test ports 1 and 2. Preferably, said two-port is designed as a direct connection between the two test ports 1, 2, but other two-ports will also be suitable, for instance correspondingly dimensioned lines whose scattering parameters are all of them known. Then, four calibration measurements are performed as is known per se on said calibration standard T from which the corresponding matrix elements may then be determined in accordance with the following mathematical explanation.

Thereafter, three further one-port units M, S, O of arbitrary—though different and known—reflection are linked, and these one-port units may either be linked in succession to one or both test ports 1 or 2 or may be linked in any desired combination to both test ports 1 or 2. In the embodiment illustrated in FIG. 2 the first one-port unit M is a matched load, the second one-port unit S is a short circuit, for example, and the third one-port unit O is an open circuit. These one-port units M, S and O may, however, be of any desired different kind, they could be short circuits with pre-connected lines of corresponding length so as to exhibit arbitrary reflection; what is important merely is that they should exhibit mutually different reflection.

These three additional one-port units M, S, O are linked successively in any desired combination to the test ports 1 and 2, as illustrated schematically in the table of FIG. 3. For example it is possible to link all three one-port units M, S and O in succession to only one test port 1 or the test port 2 as illustrated by the first and the last lines of the table.

With this total of seven measurements on four calibration standards T, M, S and O (four measurements on the two-port unit T and three subsequent further measurements on the one-port units M, S and O) it is possible to determine all of the parameters which are required in accordance with the following mathematical explanation for calculating the calibration constants of a network analyzer.

It shall be assumed in respect of the following explanations that there is a pair of linear maps for mapping the wave values $a_{3A}$, $b_{3A}$, $b_{1B}$, $a_{1B}$ of FIG. 1 for each test port on the actually available measuring values $m_1$, $m_2$, $m_3$ and $m_4$ for each four-port unit 4 and 6, respectively. The latter are mostly the digital values at the outputs of the A-D-converters of the signal detectors 8, 9 and 10, 11, respectively.

$$\begin{pmatrix} m_1 \\ m_2 \end{pmatrix} = \begin{pmatrix} A_{11} & A_{12} \\ A_{21} & A_{22} \end{pmatrix} \begin{pmatrix} a_{3A} \\ b_{3A} \end{pmatrix}, \quad (1)$$

$$\begin{pmatrix} m_3 \\ m_4 \end{pmatrix} = \begin{pmatrix} B_{11} & B_{12} \\ B_{21} & B_{22} \end{pmatrix} \begin{pmatrix} b_{1B} \\ a_{1B} \end{pmatrix}. \quad (2)$$

These equations can be obtained by algebraic conversion in a known manner. When the two test ports 1 and 2 are linked to a random two-port unit, a measured-value matrix of the following kind will result:

$$M = ANB^{-1} \text{ mit } M = \begin{pmatrix} m_1 & m'_1 \\ m_2 & m'_2 \end{pmatrix} \begin{pmatrix} m_3 & m'_3 \\ m_4 & m'_4 \end{pmatrix}^{-1}. \quad (3)$$

In this equation (3) N is the matrix of the transmission parameters of the two-port unit linked between the test ports. The measured-value matrix M is formed from measured values m and m', respectively, the m-values being obtained in the switch position I of the reversing switch 12 while the m'-values are obtained in the switch position II. The matrices A and B of equation (3) are the sought-after calibration constants.

The sequence of the calibration measurements for the individual calibration standards T, M, S and O is basically an arbitrary one; in the following example it shall be assumed that initially a calibration measurement is performed on the two-port unit T and that only then the calibration measurements are performed on the one-port units M, S and O. It is further assumed in the following example that as the two-port unit T a direct through-connection of the two test ports 1 and 2 is performed (through-connection T). However, this simplification does not in any way affect the generality of the following explanation.

The following measured-value matrix results for the through-connection T:

$$M_T = ATB^{-1} \text{ with } T = \begin{pmatrix} 1 & 0 \\ 0 & 1 \end{pmatrix}. \quad (4)$$

Hence, the four matrix elements can be obtained by means of four calibration measurements at the two-port unit T.

Thereafter, three further calibration measurements are performed with the one-port units M, S and O which—in accordance with the table of FIG. 3—are arbitrarily linked to the test port 1 or the test port 2. These three calibration measurements on the one-port units M, S and O are expressed by the following equations:

$$r_{Ai} = \frac{m_{1i}}{m_{2i}} = \frac{A_{11}r_{Ai} + A_{12}}{A_{21}r_{Ai} + A_{22}} \quad (5)$$

und $$r_{Bi} = \frac{m'_{3i}}{m'_{4i}} = \frac{B_{11} + B_{12}r_{Bi}}{B_{21} + B_{22}r_{Bi}},$$

wherein $r_{Ai}$ represents the calibration reflections which are linked to the test port 1, i.e. those from the left-hand half of the table; this applies analogously for $r_{Bi}$ in conjunction with the test port 2. In the general sense the left-hand equation (5) describes one-port measurements at port 1, and the second one applies to such measurements at port 2. By elimination of $B_{ij}$ by means of (4), two types of equations which are linear as to the magnitudes $A_{ij}$ are derived:

$$r_{Ai}A_{11} + A_{12} - r_{Ai}r_{Ai}A_{21} - r_{Ai}A_{22} = 0 \quad (6)$$

$$c_{1i}A_{11} + c_{1i}r_{Bi}A_{12} - c_{2i}A_{21} - c_{2i}r_{Bi}A_{22} = 0.$$

wherein $$c_{1i} = M_{T,22} + M_{T,21}\Gamma_{Bi} \text{ und } c_{2i} = M_{T,12} + M_{T,11}\Gamma_{Bi} \quad (7)$$

Due to the homogeneity of these equations it is not possible to determine four different $A_{ij}$, but this is not required for calibration. This means that a value should be given to which the solution is then related. Without any limitation of the generality we will choose $A_{22} = 1$ in the present case so that the equations are changed to $$r_{Ai}A_{11} + A_{12} - \Gamma_{Ai}r_{Ai}A_{21} = \Gamma_{Ai}, \quad (8a)$$

$$c_{1i}A_{11} + c_{1i}\pi_{Bi}A_{12} - c_{2i}A_{21} = c_{2i}\pi_{Bi} \quad (8b)$$

Three equations of this type are required for the three further calibration measurements. Whether these are three of type (8a) or three of type (8b) or a mixture of both types, depends on the combination according to the table of FIG. 3 in which the individual one-port units M, S and O are linked to the test ports 1 and 2. For example: for the second line of the table, according to which the one-port unit M and the one-port unit S are successively linked to the test port 1 whereafter the one-port unit O is linked to the test port 2, two equations of type (8a) and one equation of type (8b) are required, resulting in the following conditional equation for the matrix A:

$$\begin{pmatrix} r_{A1} & 1 & -r_{A1}r_{A1} \\ r_{A2} & 1 & -r_{A2}r_{A2} \\ c_{11} & c_{11}r_{B1} & -c_{21} \end{pmatrix} \begin{pmatrix} A_{11} \\ A_{12} \\ A_{21} \end{pmatrix} = \begin{pmatrix} r_{A1} \\ r_{A2} \\ c_{21}r_{B1} \end{pmatrix}. \quad (9)$$

When matrix A has been determined in this way, matrix B will result as follows:

$$B = M_T^{-1} A. \quad (10)$$

This completes the calibration. By means of the two calibration matrices A and B it is now possible to calculate the parameters $N_x$ of any desired test item by way of a simple matrix multiplication from the associated measured-value matrix $M_x$ in accordance with the following relationship:

$$N_x = A^{-1} M_x B. \quad (11)$$

This mathematical explanation shows that the method according to the present invention permits precise calibration of a network analyzer even if three different one-port units are successively linked in any desired combination to the test ports 1 and 2, respectively.

Although we have described our invention by reference to particular illustrative embodiments thereof, many changes and modifications of the invention may become apparent to those skilled in the art without departing from the spirit and scope thereof. We therefore intend to include within the patent warranted hereon all such changes and modifications as may reasonably and properly be included within the scope of our contribution to the art.

We claim:

1. A method for calibrating a network analyzer, comprising steps of:
    providing a network analyzer having two test ports;
    performing calibration measurements successively in any desired order on different calibration standards connected between the two test ports;
    when performing the calibration measurements, using as a first calibration standard two-port unit having known complex scattering parameters, said two-port unit being connected between the two test ports; and
    using as further calibration standards three one-port units of known, reflection characteristics and which are connected to only one of either of the two test ports.

2. A method for calibrating a network analyzer, comprising steps of:
    providing a network analyzer having two test ports;
    performing calibration measurements successively in any desired order on different calibration standards connected between the two test ports;
    when performing the calibration measurements, using as a first calibration standard a two-port unit having known complex scattering parameters, said two-port unit being connected between the two test ports, and making a maximum of four calibration measurements using the first calibration standard; and
    using as further calibration standards three one-port units of known, reflection characteristics and which are connected to only one of either of the two test ports, and making a maximum of three measurements, one with each of the three one-port units, whereby a total of only seven measurements are required for calibrating the network analyzer.

3. A method for calibrating a network analyzer, comprising steps of:
    providing a network analyzer having two test ports;
    performing calibration measurements successively in any desired order on different calibration standards linked between the two test ports;
    when performing the calibration measurements, using as a first calibration standard a two-port unit all of whose complex scattering parameters are known and which is linked between the two test ports; and
    using as further calibration standards three one-port units of arbitrary, though different and known, reflection characteristics and which are successively linked to only one of the two test ports.

4. A method according to claim 3 wherein the two-port unit is implemented as a direct connection of the two test ports.

5. A method according to claim 3 wherein one of the one-port units is a matched one-port unit.

6. A method according to claim 3 wherein one of the one-port units is implemented as a short circuit.

7. A method according to claim 3 wherein one of the one-port units is implemented as an open circuit.

8. A method according to claim 3 wherein at least one of the one-port units is implemented as a short circuit with a pre-connected line of predetermined length.

* * * * *